United States Patent
Panaoussis

[19]

[11] Patent Number: 5,949,355
[45] Date of Patent: Sep. 7, 1999

[54] METHOD AND APPARATUS FOR ADAPTIVE DATA COMPRESSION

[75] Inventor: Spyros Panaoussis, Chicago, Ill.

[73] Assignee: Cennoid Technologies, Inc., Oakbrook, Ill.

[21] Appl. No.: 08/915,961

[22] Filed: Aug. 21, 1997

Related U.S. Application Data

[63] Continuation of application No. 08/350,426, Dec. 6, 1994, Pat. No. 5,684,478.

[51] Int. Cl.[6] .................................................. H03M 7/30
[52] U.S. Cl. ................................................. 341/51; 341/76
[58] Field of Search ................................ 341/51, 63, 76, 341/106

[56] References Cited

U.S. PATENT DOCUMENTS

| | | |
|---|---|---|
| 3,394,352 | 7/1968 | Wernikoff et al. . |
| 3,772,654 | 11/1973 | Evans et al. . |
| 4,355,306 | 10/1982 | Mitchell . |
| 4,612,532 | 9/1986 | Bacon et al. ............................. 341/51 |
| 4,642,793 | 2/1987 | Meaden .................................. 364/900 |
| 4,701,744 | 10/1987 | DeVilbiss ................................ 341/90 |
| 4,804,959 | 2/1989 | Makansi et al. ........................ 341/59 |
| 4,843,389 | 6/1989 | Lisle et al. .............................. 341/106 |
| 5,003,307 | 3/1991 | Whiting et al. ......................... 341/51 |
| 5,016,009 | 5/1991 | Whiting et al. ......................... 341/51 |
| 5,043,728 | 8/1991 | Hoshi et al. ............................ 341/106 |
| 5,045,852 | 9/1991 | Mitchell et al. ........................ 341/51 |
| 5,229,863 | 7/1993 | Kao et al. ............................... 358/426 |
| 5,369,405 | 11/1994 | Choi et al. .............................. 341/63 |
| 5,386,211 | 1/1995 | Goveas .................................. 341/51 |
| 5,426,779 | 6/1995 | Chambers, IV ........................ 395/600 |
| 5,493,407 | 2/1996 | Takahara ............................... 358/261.1 |

Primary Examiner—Marc S. Hoff
Attorney, Agent, or Firm—Welsh & Katz, Ltd.

[57] ABSTRACT

The present invention relates to data compression systems and methods wherein text can be compressed by encoding repetitions of blocks of characters, or through a straight encoding scheme that converts eight-bit character values to four-bit character values by eliminating values for characters that are not valid word-starting characters or valid next-letter characters for a given preceding letter. Block compression is accomplished through the use of data structures that track the successive occurrence of valid block-repetition starting characters, and their lengths. Repeat-relative block compression is accomplished by detecting character sequences that can be expressed as the value of a previously-occurring character sequence plus or minus an offset.

10 Claims, 3 Drawing Sheets

BLOCK STRUCTURES

FIG. 1

VALTBL 1, 0, 2, 3, 4, 0, 0, 5, 6, 0, 0, 7, 8, 9, 10, 11, 0, 12, 13, 14, 15, 0, 16, 0, 0, 0

SCNTBL    FIG. 2

| | | |
|---|---|---|
| 01h, 23h, 04h, 50h, 60h, 78h, 9ah | ; [A] | BCDFGIKLM |
| 0bh, 0ch, 0deh, 0fh, 00h, 11h | ; | NPRSTVY |
| 1ah, 00h, 20h, 00h, 3dh, 04h, 05h | ; [B] | ABEIJL |
| 60h, 07h, 0b0h, 8ch, 00h, 90h | ; | NORSUVY |
| 10h, 23h, 40h, 05h, 60h, 78h, 00h | ; *[C] | ACDEHIKL |
| 90h, 0ah, 0bh, 0c0h, 00h, 00h | ; | ORTU |
| 10h, 02h, 30h, 0b0h, 40h, 0ch, 0deh | ; [D] | ADEIGLM |
| 50h, 06h, 78h, 9fh, 00h, 0a0h | ; | ORSTUYNV |
| 10h, 23h, 45h, 60h, 00h, 0dh, 78h | ; [E] | ACDEFGLM |
| 90h, 0ah, 0bch, 0eh, 0fh, 11h | ; | NORSTVXY |
| 10h, 00h, 23h, 00h, 40h, 05h, 00h | ; *[F] | AEFIL |
| 60h, 07h, 08h, 90h, 00h, 0a0h | ; | ORTUY |
| 10h, 02h, 30h, 45h, 60h, 07h, 08h | ; [G] | ADEGHIL |
| 90h, 0ah, 0bch, 0d0h, 00h, 0e0h | ; | NORSTUY |
| 10h, 00h, 20h, 00h, 30h, 00h, 04h | ; [H] | AEI |
| 50h, 06h, 07h, 80h, 00h, 90h | ; | NORTUY |
| 10h, 23h, 45h, 60h, 00h, 07h, 89h | ; *[I] | ACDEFGLM |
| 0abh, 0ch, 0deh, 0fh, 00h, 22h | ; | NOPRSTVZ |
| 10h, 00h, 20h, 00h, 00h, 00h, 00h | ; [J] | AE |
| 30h, 00h, 00h, 40h, 00h, 00h | ; | OU |
| 10h, 00h, 20h, 00h, 30h, 04h, 05h | ; [K] | AEIL |
| 00h, 00h, 60h, 70h, 00h, 00h | ; | NSU |
| 12h, 34h, 5eh, 00h, 60h, 07h, 00h | ; [L] | ABCDEFIL |
| 89h, 00h, 0abh, 0cfh, 00h, 0d0h | ; | OPSTUVY |
| 12h, 00h, 30h, 00h, 40h, 00h, 50h | ; *[M] | ABEIM |
| 67h, 00h, 80h, 90h, 00h, 0a0h | ; | OPSUY |
| 10h, 23h, 45h, 60h, 70h, 89h, 0ah | ; [N] | ACDEFGIKL |
| 0b0h, 00h, 0cdh, 0efh, 00h, 11h | ; | NOSTUVY |
| 00h, 12h, 03h, 40h, 50h, 06h, 78h | ; [O] | CDEFGILM |
| 9ah, 0bh, 0cdh, 0efh, 11h, 00h | ; | NOPRSTUVW |
| 10h, 00h, 20h, 34h, 50h, 06h, 00h | ; *[P] | AEGHIL |
| 78h, 09h, 0abh, 0c0h, 00h, 0d0h | ; | OPRSTUY |
| 00h, 00h, 00h, 00h, 00h, 00h, 00h | ; *[Q] | |
| 00h, 00h, 00h, 10h, 00h, 00h | ; | U |
| 10h, 23h, 40h, 50h, 60h, 78h, 9ah | ; [R] | ACDEGIKLM |
| 0b0h, 0ch, 0deh, 0f0h, 00h, 11h | ; | NORSTUY |
| 10h, 20h, 30h, 04h, 50h, 67h, 89h | ; [S] | ACEHIKLM |
| abh, 0bh, 0cdh, 0eh, 0f0h, 11h | ; | NOPSTUWY |
| 10h, 20h, 30h, 04h, 50h, 06h, 00h | ; *[T] | ACEHIL |
| 70h, 09h, 9ah, 060h, 0c0h, 0d0h | ; | ORSTUWY |
| 12h, 34h, 50h, 60h, 70h, 08h, 0ah | ; *[U] | ABCDEGILM |
| 0bh, 0ch, 0deh, 00h, 00h, 00h | ; | NPRST |
| 10h, 00h, 20h, 00h, 30h, 00h, 00h | ; *[V] | AEI |
| 40h, 00h, 00h, 00h, 00h, 00h | ; | C |
| 10h, 02h, 30h, 04h, 50h, 0ah, 06h | ; [W] | ADEHIL |
| 70h, 08h, 90h, 00h, 00h, 00h | ; | NORE |
| 10h, 20h, 30h, 00h, 40h, 00h, 00h | ; [X] | ACEI |
| 05h, 00h, 06h, 00h, 00h, 00h | ; | PT |
| 01h, 23h, 40h, 00h, 50h, 00h, 60h | ; [Y] | BCDEIM |
| 78h, 00h, 09ah, 00h, 060h, 00h | ; | OPSTW |
| 10h, 00h, 20h, 00h, 30h, 00h, 00h | ; [Z] | AEI |
| 45h, 00h, 00h, 00h, 00h, 60h | ; | OPY |

METHOD AND APPARATUS FOR ADAPTIVE DATA COMPRESSION

This is a continuation of application Ser. No. 08/350,426, filed Dec. 6, 1994 U.S. Pat. No. 5,684,478.

BACKGROUND

Field of the Invention

The present invention relates generally to data storage and communication, and particularly to systems for compressing data to facilitate denser data storage and faster data communication.

The present invention consists of a number of specialized data compression subsystems—each designed to compress a particular type of data—that are utilized to implement an adaptive, data-indifferent compression system that has achieved an average compression ratio for all files and data types in excess of 3:1. The compression system made possible through the present invention adapts to any type of data by combining to achieve optimum overall compression. Tested over a range of files including bitmap, database, spreadsheet, ASCII, EBCDIC, and text/word processor files, this data compression system has achieved compression ratios ranging from 2.7:1 to nearly 10:1. The data compression systems of the present invention can be used to compress data in any language, text or binary format, regardless of its machine language encoding.

It is thus an object of the present invention to facilitate denser data storage.

It is another object of the present invention to facilitate faster data communication.

It is another object of the present invention to provide a compression system capable of adapting to different data types.

The data compression system of the present invention is implemented in three main functional groups: the scanners, the decision engine, and the compression modules.

The scanners are implemented in two stages, called Copy Scan and Main Scan. The scanners handle input from a data file. The file can be either a data storage file or a data communication file. The file consists of a stream of bytes or characters, a byte typically containing eight (8) bits of data. Before scanning, the file is divided into records (in the preferred embodiment, a record is 2048 bytes long) by the user or application, and the scanner then processes the file one record at a time. The scanners examine the data and produce a data profile report.

The data profile report is a detailed breakdown of the different types of data characters and groups in the record. The report indicates the identity of each byte of data and classifies each byte into one of eight categories. The report gives the frequency with which specific characters and groups of characters occur in the record and the relative position of those characters and groups. The report also indicates the identity and location of characters, words and phrases that are repeated within the record. Once the report is compiled, it is passed on to the decision engine.

The decision engine processes the data profile report and classifies the entire record as fitting into one of eight data composition profiles, or modes. The decision acts according to a set of statistical rules. Based on the report's indication of the content of the data record, the decision engine constructs a program for optimum compression of the record. The program made by the decision engine consists of detailed instructions regarding application of the compression modules. Each compression module is a highly specialized compression subsystem designed to compress a specific type of data (E.g., ASCII capitals, Hexadecimal numerics, etc.). The decision engine's program specifies which compression modules are to be applied and the order in which they are to be applied, as well as the conditions that will mandate branching from one module to another for better compression.

The modules then compress the data, branching among themselves according to the instructions provided by the decision engine. Thus, execution of the compression modules is dynamically adaptive (following the "road map" provided by the decision engine) for optimum compression.

The invention is described in greater detail in the detailed description of the preferred embodiment, and the drawings and claims.

DESCRIPTION OF THE DRAWINGS

FIG. 1 shows the table VALTBL which is used in text compression.

FIG. 2 shows the table SCNTBL which is used in text compression.

DETAILED DESCRIPTION OF THE PREFERRED EMBODIMENT

Summary of Operation

Figure 3:
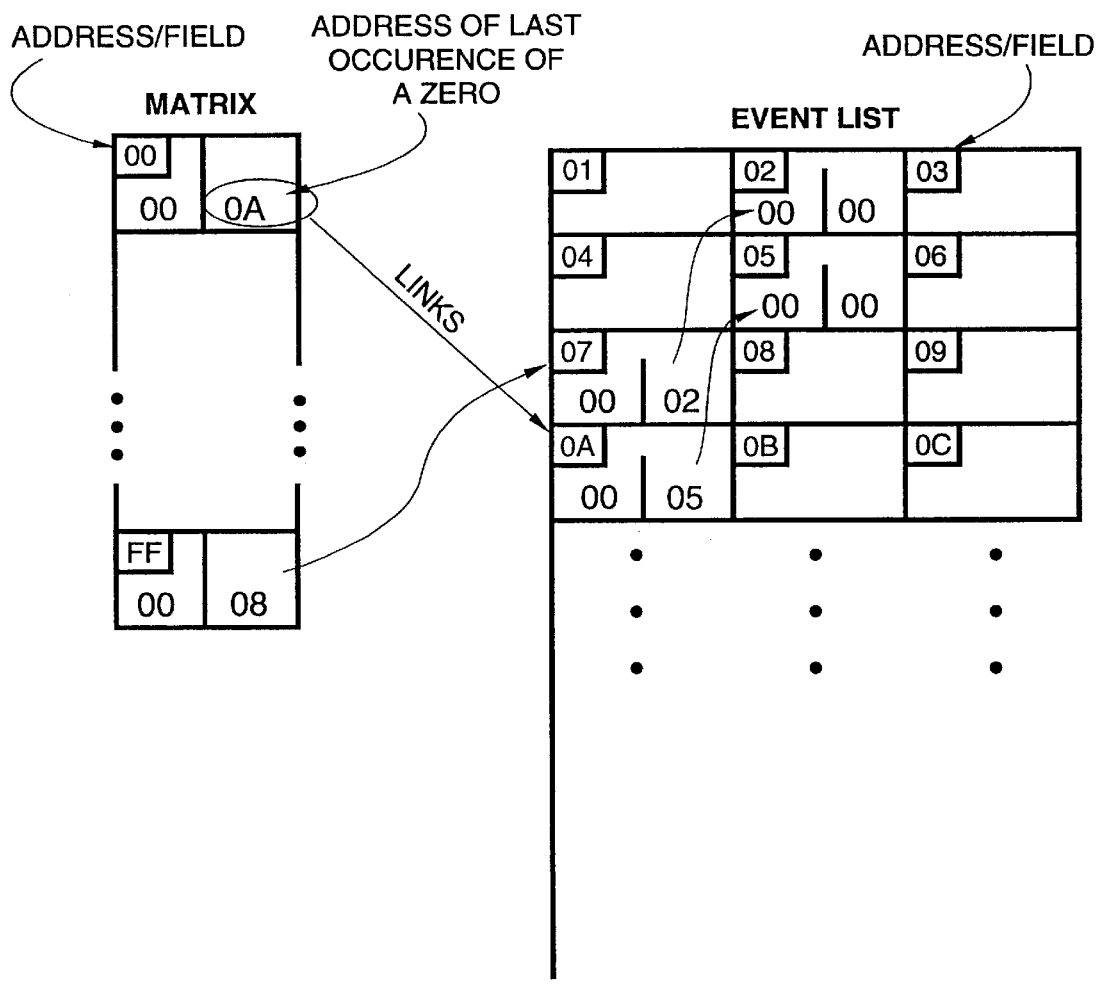
FIG. 3 shows the data structures Event Matrix and Event List which are used for block coding.

Data compression through the system of the present invention involves five major steps: (1) Copy Scan; (2) Initial Evaluation; (3) Main Scan; (4) Statistics/Decision Engine; and (5) Compression. Each step is described below.

Preliminary Steps by the Application or User

Before the first step of inputting the data to the compression system, the data file is opened and one record is read into a source buffer by the user or application. The application also allocates a 16 kilobyte work area for use by the compression system and prepares a parameter field in the first 16 bytes of the work area. The parameter field is the device through which the application and the compression system communicate with each other regarding the address of the source buffer, the length of the uncompressed data record (usually 2048 bytes), the size of the compressed record, and the location of the output. It will be appreciated by those of skill in the art that the preliminary steps performed by the application or user are standard practices and are not a part of the present invention. Once these preliminary steps are executed, the application or user then calls the compression system.

Copy Scan

The input stage of the compression system performs the initial scan, called the Copy Scan. The Copy Scan is a data copy, identification and report loop. The Copy Scan uses the 16 kilobyte work area allocated by the user or application. The work area is divided into sections for variables, report fields, vectors, buffers and mapping sections. The work area sections used during the Copy Scan are the DATA COPY buffer, the QUE/ID buffer, and the Group Report Table.

During the Copy Scan, the compression system copies the record to a buffer and scans it to identify and characterize its contents. First, the record is copied sequentially to CPYBUF (the DATA COPY buffer). As each byte is copied, a counter in the Group Report Table corresponding to the particular character detected is incremented, thereby tracking the number of times each individual character occurs in the record (i.e., the number of As, the number of spaces, the number of bs, etc.). Each byte is also classified according to which of eight data groups it belongs, as determined by the character groupings defined in the internal table IDTBL (identification table), as set forth below in Table 1.

TABLE 1

| the IDTBL value | Low Range Symbol | 00d (00h) |
|---|---|---|
| | ASCII Numeric Digit | 02d (02h) |
| corresponding to | ASCII Capital Letter | 04d (04h) |
| | ASCII Lower Case Letter | 06d (06h) |
| the class | High Range Symbol | 08d (08h) |
| | EBCDIC Numeric Digit | 10d (0Ah) |
| identification for | EBCDIC Capital Letter | 12d (0Ch) |
| | EBCDIC Lower Case Letter | 14d (0Eh) |
| each byte is stored | | |

Initially, the IDTBL value corresponding to the class identification for each byte is stored sequentially in QUEBUF, 2048 bytes from the corresponding character identification code in CPYBUF (these values will be replaced in a later scan by codes calling specific compression modules and indicating the number of characters in a word or number). As each byte is identified as being in one of the above categories, a counter corresponding to that category is incremented in the Group Report Table.

The eighth bit state of each byte is tracked in order to detect if the record is comprised of full range binary data. The system uses a logical OR operation on the eighth bit to detect a HIGH value in the eighth bit; if one is detected, then other checks are executed to determine if the data is full range binary. The ASCII group counters are checked for a low or zero aggregate count, and the EBCDIC group counters are checked for a high aggregate count. If these conditions are found, then the data is identified as EBCDIC and translated to ASCII equivalents to simplify compression. A flag is set to indicate the translation from EBCDIC, so that the decompression system will know to translate the data back to EBCDIC. The identification of the record as ASCII or full range binary is also used to set the Range Limiters used during the Main Scan. For ASCII, the Range Limiters are set at 128; for full range binary they are set at 256.

From the third character on, Copy Scan activates a check to detect contiguous repetition of characters and character pairs. If Copy Scan detects a byte as being a repetition of the preceding byte, then it branches to the Repeat Scan subroutine. The Repeat Scan subroutine then scans the entire record to detect repeat events. The Repeat Scan subroutine then stores codes in the Que Buffer and Auxiliary Buffer indicating the location and length of each repetition found, and also updates the corresponding Repeat Event Counters in the Group Report Table. The Repeat Scan subroutine does not update the counts of individual characters or character groups, nor does it continue to execute the eighth-bit OR operation. When the Repeat Scan subroutine is finished, it branches back to the Copy Scan. Copy Scan then finishes scanning the non-repetitive bytes in the record.

Initial Evaluation

The Initial Evaluation step uses the information gathered during Copy Scan to make adjustments to the Main Scan. These adjustments ensure that the Main Scan proceeds more quickly and efficiently.

The identification steps executed in Copy Scan provide useful information regarding the makeup of the record, such as the existence of ASCII and EBCDIC groups, which classes of characters (per IDTBL) are used and the individual characters used in each class. Based on this information, the Initial Evaluation can designate what types of data the Main Scanner should look for and what types of data it should ignore, or drop. The designation of what to look for and what to drop is in terms of the eight data classifications in IDTBL Thus, for example, if the counters in the Group Report Table corresponding to ASCII capital letters (character ID 04h) are low, the Initial Evaluation might designate that ASCII capital letters be dropped and not looked for during the Main Scan. In that event, any ACSII capital letters contained in the record will be encoded and compressed as parts of block repetitions or some other repetition event, as special characters, or they might not be compressed at all.

Main Scan

The Main Scan completes the scanning of the record that was commenced by Copy Scan. The Main Scan has fewer groups to identify, so it is quicker and more complete than the Copy Scan.

The Main Scan identifies characters, character patterns and groupings, such as repetition events (character, pair, quad, block), random characters, symbol words, and numbers. Based on this information, Main Scan returns flags and sets counters indicating which and how many of the foregoing entities are present (SYM=symbols, RPT=repeats, NMBR=numbers, WRD=words, BNRY=binary, CAPS=capital letters, LWR=lower case letters, NUM=non-hexadecimal numbers, HEX=hexadecimal numbers). Main Scan assigns values to the relevant variables (SMBLCNT, RPTCNT, NMBRCNT, WRDCNT, BNRYCNT).

The Main Scan updates the character frequency table (which was not updated during the Copy Scan to account for characters present in the repetition events scanned by the Repeat Scan subroutine), and other counters in the Group Report Table that were not updated during the Copy Scan. The Main Scan also executes the character blocking function. In the character blocking function, the Main Scan detects multiple occurrences (as contrasted with contiguous repetitions) of the same block of characters (e.g., the word "the") and encodes them as block repetitions.

The information gathered during Main Scan is compiled into a detailed report. From the report, the Decision Engine will know the record's contents in detail—in terms of capital words, lower case words, mixed words, numbers, hexadecimal numbers, repetition events, and symbols. The report also gives a count of the number of times individual characters are found in the record (E.g., 128 spaces, 25 A's, etc.). The information in the report compiled by the Main Scan is used by the next system stage, namely the Statistics/Decision Engine stage, to determine the next step; i.e., to evaluate which compression subsystems are likely to achieve the best compression.

Statistics/Decision Engine

The Statistics/Decision Engine step contains the intelligence of the compression system. Based on the information compiled during the preceding scans, the Decision Engine establishes the priority of application of the individual compression modules. The input to the Decision Engine is the report of the record's contents prepared by the scanning operations. Based on the record's contents, the Decision Engine assigns one of eight modes to the record, as indicated in Table 2:

TABLE 2

| MODE | MAJOR RECORD CONTENTS | MINOR RECORD CONTENTS |
| --- | --- | --- |
| 00 | CAPS | SYM (Default) |
| 01 | CAPS | LOWER and SYM |
| 02 | LOWER | SYM |
| 03 | LOWER | CAPS/SYM |
| 04 | NUM or HEX | SYM |
| 05 | NUM and CAPS | SYM |
| 06 | NUM and LOWER | SYM |
| 07 | CAPS/LOWER/NUM/SYM | (Random in Binary) |

As is seen in Table 2, the modes are as follows. Mode 00 is the default mode, where the major record contents (not counting repetition and block events) are capital letters and the minor record contents are symbols. Mode 01 is assigned where the major record contents are capital letters and the minor record contents are lower case letters and symbols. Mode 02 is assigned where the major record contents are lower case letters, and the minor record contents are symbols. Mode 03 is assigned where the major record contents are lower case letters and the minor contents are capital letters and symbols. Mode 04 is assigned where the major record contents are either non-hexadecimal numbers or hexadecimal numbers and the minor record contents are symbols. Mode 05 is assigned where the major record contents are non-hexadecimal numbers and capital letters and the minor contents are symbols. Mode 06 is assigned where the major record contents are non-hexadecimal numbers and lower case letters and the minor contents are symbols. And Mode 07 is assigned where there is an equal or random mix of capital and lower case letters, numbers and symbols.

The Decision Engine also selects special characters (e.g., if a certain character occurs frequently in the record, a special four-bit compression code can be assigned to that character instead of its eight-bit ASCII code), builds a header that is inserted at the beginning of the compressed record (the header describes the types of compression applied, for use by the decoder), refines the block coding done in the Main Scan, and translates EBCDIC to ASCII setting a translation flag as necessary.

The Record Header

The record's header indicates the record's mode and its compressed length. The header also contains sixteen prefix usage descriptor flags that indicate which character zones are present in the compressed record. Any zones that are not present are available for use as special character codes.

Mode Field

The first bit in the mode field serves as a flag that indicates whether the data to follow is ASCII or not. The four-bit mode field also contains a one-bit flag that indicates whether the data is normal (ASCII) or reversed (translated) (BIN and EBCDIC). As an illustrative example, a zero (0) may be used to indicate ASCII and a one (1) would then indicate binary (BIN). The remaining three bits of the mode field indicate the particular mode assigned to the record by the decision engine for the purposes of compression. Since there are three bits that identify the mode, it should be clear that one of eight modes is possible. The assigned mode is based upon the statistical content of the record as analyzed by the scanner.

Header Descriptor Field

The header descriptor field describes the assignment of coding prefixes and special character: Each of the sixteen flags in this field represents one zone or prefix For example, in the case of zone 4, if a zone 4 value (i.e., 04 through F4) is coded as such in the compressed record, then the header descriptor flag corresponding to zone 4 (bit number 4) will indicate that zone 4 values are present in the compressed record, and accordingly, the value 4 cannot be used as a special character code. Conversely, if no zone 4 values are present in the record, then the value 4 may be assigned as a special character code.

Zones 8–F are typically reserved as codes indicating various events that might be present in the record, such as character repetition, character pair repetition, and block repetition events (if no events corresponding to a particular zone occur in the record, then that zone is available for use as a different compression code, such as special character). The event codes are used as prefixes to indicate the type of coding that follows the prefix. The default values assigned to the event codes are as follows. Groupings of letters (words) and numbers are indicated by prefix values of 8, 9, and C. A prefix value of A is used to denote contiguous character repetition and pair repetition events. Non-contiguous repetition of a block of characters is indicated by prefix values of E and F. The remaining prefix values, B and D, may be available a special character codes or additional values for indicating block repetition events.

Assignment of Special Character Codes

The descriptor field is used to assign special character code values. Special character codes are used to optimally compress certain characters, typically characters that appear frequently in the record. Using these codes, an eight-bit ASCII code for the character is compressed into a 4-bit special character code.

In the descriptor field, a one (1) in a bit corresponding to one of the zones means that characters corresponding to the zone are coded in the compressed record, and therefore the zone is used in the compressed record and that value is not available for assignment as a special character code. A zero (0) means that the compressed record does not contain characters in the corresponding zone, nor (in the case of zones 8–F) does it contain an event whose prefix is in that zone, so the value corresponding to the bit containing the zero is available and may be assigned as a special character code.

In that event, a list of the characters in the record that will be represented by special character codes is inserted following the descriptor field—one character per zero bit in the descriptor field. The value corresponding to the first zero bit in the descriptor field is assigned as the special character code for the first (sixteen bit ASCII) character in the special character list, the value of the second zero bit is assigned as the code for the second character in the list, and so on. As an example, consider the following header descriptor and special character fields:

| Header Descriptor | Characters To Be Assigned Sp. Ch. Codes | | |
| --- | --- | --- | --- |
| 1011 1111 0011 1111 | 0010 0000 | 0010 1100 | 0010 1110 |

The number sequence in the Header Descriptor indicates that zones 0, 2, 3, 4, 5, 6, 7, A, B, C, D, E, F are used as either character codes or event codes (prefixes) in the compressed record, and are not available to be assigned as special character codes. The values of the zero bits (1, 8 and 9), on the other hand, are available to be assigned as special character codes. This means that the compressed record does not contain coded character values in zone 1, nor does it includes any events whose prefixes are 8 or 9 (two of the default values for groupings of numbers and words).

Corresponding to the three zero bits in the descriptor field are the ASCII codes for the characters that have been selected to be represented by special character codes. The first character is 20h (space), and will be compressed as 1 (0001); the second character, 2Ch (comma) will be compressed as 8 (1000); and the third character in the list, 2E (period or decimal point) will be compressed as 9 (1001). Thus, the sequence "," is coded during compression as 81 (1000 0001), and the sequence "." is coded as 911 (1001 0001 0001).

Following the third character in the list, either the compressed data will start (ASCII MODE) or the extended descriptor will be found (BIN MODE).

Extended Header Field

If the record is a BIN (or an EBCDIC) record, then the header is identical to the ASCII header described above, except that (1) a sixteen-bit extended header is added between the special character list and the start of the compressed data, and (2) a bit stream of undetermined length is added after the compressed data. The extended header is comprised of two four-bit binary mode flags, and a one-byte field to indicate bit stream length. The sixteen-bit extended header field, which appears only in BIN (binary) mode, indicates whether or not special random process modules, and the prefixes assigned to them, are used. If the binary mode flags are set, then before applying any compression modules, the BIN record is converted to ASCII.

Call Compression Modules

Once the Decision Engine makes its decisions regarding application of the individual Compression Modules and transmits its instructions to the Compression Modules, the Decision Engine then calls the Compression Modules. During compression by the modules, the Decision Engine monitors the compression and, if a branch condition occurs, the Decision Engine directs the current module to branch to the next module, as determined by the priorities set by the Decision Engine.

The Compression Modules

The Compression Modules execute compression of the record pursuant to the Decision Engine's instructions, branching among themselves as directed by the Decision Engine to maximize compression of the record.

The compression modules may be separated into the following three groups for the purpose of description and discussion: Numerics, Text, and Repetition Event. Block repetitions are a subset of the Repetition Events.

Compression Module (Coding) Prefixes

The various compression codes are represented by prefixes, as set forth below. Other prefix schemes will be apparent to persons of skill in the art, who will recognize that the choice of specific prefix values can be varied from the examples set forth herein without departing from the scope of the present invention.

| Module and Description | | Prefix | |
|---|---|---|---|
| NMBR00: Non-hex numeric digits with last digit LOW (<6). | 08 | To encode, add 10d to the last digit in the string. This ensures that the last coded digit is represent by A - F. When a value A - F is encountered, this indicates the end of the encoded non-hex numeric. | |
| NMBR02: Non-hex numeric digits with last digit HIGH (>5). | 09 | To encode, add 4d (or 5d or 6d) to the last digit in the string. | |
| NMBR04: Binary coded numeric <100. | 08 | | |
| NMBR06: Binary coded numeric >99. | 09 | | |
| NMBR08: Short numeric: with trailing zeroes (e $\bullet$ 10$^X$). | 0C | | |
| NMBR0A: Long numeric with trailing zeroes (e $\bullet$ 10$^X$). | 0C | | |
| LTRS00 (Caps Pair) and LTRS02 (Lower Case Pair). | 08 | | |
| LTRS04 (Caps Triad plus space) and LTRS06 (Lower Case Triad). | 0C | | |
| LTRS08 (Mixed Record Caps) and LTRS0A (Mixed Record Lower plus space). | 09 or 0C | | |
| LTRS0C (Fixed Letter Sequence). | 09 | | |
| LTRS0E (Special Case). | 0C | | |
| Character Repeat - Special | 00–07 | (0000 0ddd, where d = "don't care") | |
| Character Repeat - Not Special | | | |
| Short: 3–8 repetitions | 8A–8F: | 1000 10d + L (L = reps − 3) | |
| | Example: | Reps = 8 | |
| | So: | L = 8 − 3 = 5 | |
| | Lo 4 bits: | 10d + L = 10d + 5 = 15d | |
| | (Fh) Code: | 1000 1111, or 8F | |
| Medium: 9–12 repetitions | 9A–9D: | 1001 7d + L (L = reps − 6) | |
| Long: 13–44 repetitions | 9E0–9FF: | 1001 111L LLLL (L= reps − 13) | |
| Normal Repeat - Any Character | | | |
| Short: 2–11 repetitions | A: | 1010 LLLL (L = reps − 2) | |
| Med: 12–19 repetitions | AA: | 1010 1010 0LLL (L = reps − 10) | |
| Long: 20–147 repetitions | AA8–AAF: | 1010 1010 1LLL LLLL (L = reps − 8) | |
| Very Long: 148–2047 repetitions | AB8–ABF: | 1010 1011 1LLL LLLL LLLL(L = reps − 128) | |

-continued

| Module and Description | Prefix | |
|---|---|---|
| Pair Repeat - Special Pair | 0F | |
| Pair Repeat - Normal | | |
| Short: 1–4 repetitions | AC–AF: | 1010 12d + L (L = reps – 1) |
| Medium: 5–68 repetitions | AB80–ABBF: | 1010 1011 10LL LLLL(L = reps – 5) |
| Long: 69–1092 repetitions | ABC00–ABFFF: | 1010 1011 11LL LLLL LLLL (L = reps – 69) |
| Pair Repeat - Relative: Two or more matching character pairs within 63 bytes of one another. | | PPPP FSDD DDDD FSDD DDDD . . . FSDD DDDD<br>P = prefix<br>F = flag<br>S = sign<br>D = difference |
| Quad Repeat - Relative: Two or more matching groups of four characters within 1023 bytes of one another. | | PPPP FSDD DDDD DDDD FSDD DDDD . . . FSDD DDDD DDDD |
| Low Relative Repeat: Groups of five matching characters, each character being within 3 bytes of the previous occurrence. May be longer, but always a multiple of five. | | PPPP F SDD SDD SDD SDD . . . F SDD SDD SDD SDD . . . F |
| ZNZB (Zero/Nibble/Zero/Byte). Sequence of four bytes in the format:  00h 0Xh 00h XXh. Eliminate the zero nibbles. | | PPPP XXXX XXXX XXXX |
| Special Character | | Zero (0) in one of the sixteen bits in the header descriptor field; bit no. is the special character code for the corresponding character in the list following the header descriptor field (E.g., if bit no. 8 = 0, and it is the first zero in the field, then the special character code for the first character listed after the field is 8 -- if the first character listed is a space, then 8 = space). |
| Block-to-Block Repeat (no displacement) | | |
| Short (BL < 9) | B0–B7: | 1011 0LLL (L = BL – 1) |
| Long (8 < BL < 138) | B80–BFF: | 1011 1LLL LLLL (L = BL – 9) |
| Normal Block Repeat | | |
| Very Short Block / Very Short Displacement<br>(2 < BL < 11 / 0 < BD < 33) | D00–DFF: | 1101 LLLD DDDD<br>L = BL – 3<br>D = BD – 1 |
| Short Block / Short Displacement<br>(BL < 19 / BD < 256) | E000–EFFF: | 1110 LLLL DDDD DDDD<br>L = BL – 3<br>D = BD – 1 |
| Short Block / Long Displacement<br>(BL <19 / BD < 2049) | F0000–FFFFF: | 1111 0LLL LDDD DDDD DDDD<br>L = BL – 3<br>D = BD |
| Medium Block/ Short Displacement<br>(18 < BL < 60 / BD < 256) | F8000–F9FFF: | 1111 100L LLLL DDDD DDDD<br>L = BL – 19<br>D = BD |
| Medium Block / Med. Displacement<br>(18 < BL < 60 / 255 < BD < 384) | | FA LLLL LDDD DDDD<br>L = BL – 19<br>D = BD – 256 |
| Medium Block / Long Displacement<br>(18 < BL < 60 / 383 < BD < 2049) | | FB LLLL LDDD DDDD DDDD<br>L = BL – 19<br>D = BD |
| Med. Long Block / Any Disp.<br>(31 < BL < 96) | FC . . . - FD . . . | 1111 110L LLLL LDDD DDDD DDDD<br>L = BL – 32 |
| Long Block / Any Displacement<br>(63 < BL < 319) | | FE 0LLL LLLL LDDD DDDD DDDD<br>L = BL – 64 |
| Very Long Block / Any Disp.<br>(318 < BL < 2049) | DDDD | FE 10LL LLLL LLLL LDDD DDDD<br>L = BL – 319 |

The groupings of compression modules are described more fully below.

Numerics Compression Modules

The numerics compression modules are designed for records that contain some numeric digits. The numerics compression modules are grouped into the major numerics modules, minor numerics modules, and hexadecimal numerics modules.

The major numerics modules are used for records that are mostly non-hexadecimal numeric, i.e., modes 04, 05, and 06. The major numerics modules are NMBR08 and NMBR0A. These modules are designed to compress a number that contains trailing zeroes.

The minor numerics modules are used for records that are mostly non-numeric but contain some non-hexadecimal numbers, i.e., mode 00, 01, 02, 03 and 07. The minor numerics modules are NMBR00, NMBR02, NMBR04, and NMBR06.

The hexadecimal module is used for records that are mostly alpha-numeric digits, 0–9 and A–F, i.e., mode 04 records.

NMBR00. This module is invoked for compressing non-hexadecimal numerics whose last digit is LOW—less than six (6). The default prefix used to indicate this compression module is 08h. The number is compressed by converting each digit (except the last one in the string) from its eight-bit ASCII code to its four-bit binary representation. For example, the number 4, whose ASCII code is 34h (0011 0100), would be coded as 4h (0100), which is four bits instead of eight. The last digit in the string is encoded by adding 10d to it; thus, a last digit of one (1) is encoded as Ah (1010). Converting the last digit in this manner ensures that the last coded digit is represent by one of the hexadecimal values A through F. Thus, when a hexadecimal value in the range of A through F is encountered, this indicates the end of the encoded non-hex numeric string. NMBR02. This module is invoked for compressing non-hexadecimal numerics whose last digit is HIGH—greater than five (5). The default prefix used to indicate this compression module is 09h. The number is compressed in the same manner as with NMBR00, except that a different value (4, 5 or 6) is added to the last digit in the string to ensure that the compressed string ends with a hexadecimal value in the range A through F.

NMBR04. This module is invoked for compressing binary coded numerics whose value is less than 100. The default prefix used to indicate this compression module is 08h.

NMBR06. This module is invoked for compressing binary coded numerics whose value is greater than 99. The default prefix used to indicate this compression module is 09h.

NMBR08. This module is invoked for compressing short numerics followed by trailing zeroes. Such a numeric is compressed by encoding the number as $N=(e \cdot 10^x)$. The default prefix used to indicate this compression module is 0Ch.

NMBR0A. This module is invoked for compressing long numerics followed by trailing zeroes. The compression is the same as for NMBR08. The default prefix used to indicate this compression module is 0Ch.

Text Compression Modules

Special Character. As described in connection with the compressed record header, certain characters, typically those that appear most frequently in the record, can be compressed as a four-bit special character.

LTRS00 and LTRS02. These modules are invoked for compressing pairs of letters, and are used where the record contains only or mostly capital letters (for LTRS00), or only or mostly lower case letters (for LTRS02). The default prefix used to indicate both of these compression modules is 08h.

The modules are activated by the setting of a flag in an internal grouping of prefix values that are distinct from the prefixes that are used in coding. The internal prefix grouping is simply a set of internal flags used by the system to indicate which of several different coding schemes a given coding prefix will indicate. To activate the modules, PRFX08 (in the internal prefix group) in the internal grouping is set to a certain value which indicates that the coding prefix 08h is assigned to LTRS00 and LTRS02 coding for pairs of letters.

For compression, the letters pair is encoded as PPPP CCCC CCCC, where P is the prefix (1000) and C is the ASCII code of the character in the pair.

LTRS04 and LTRS06. These modules are invoked for compressing a letters triad (e.g., "AAA"). The default prefix used to indicate these compression modules is 0Ch. As with LTRS00 and LTRS02, these modules are activated through the setting of a flag in the internal prefix grouping. When PRFX0C is set to a certain value, the triad modules, LTRS04 and LTRS06 are activated. A letters triad is encoded as the prefix 0Ch followed by the ASCII code of the character in the triad.

LTRS08 and LTRS0A. These modules are invoked for compressing a mixed record consisting of all or mostly capital letters (LTRS08), or all or mostly lower case letters (LTRS0A). The default prefix used to indicate these compression modules is 09h. The flag-setting system described above in connection with LTRS00–LTRS06 is also used to activate these modules. The flag is set in PRFX09 of the internal prefix grouping. The text is compressed in the form PPPP FLLL CCCC . . . CCCC, where P is the prefix of 9h (1001), F is a flag indicating capitals or lower case, and C is the coded text.

LTRS0C. This module is invoked for compressing a fixed letter sequence that comprises a valid word. The default prefix used to indicate this compression module is 09h. The compression proceeds in the same manner as described above for LTRS08 and LTRS0A.

Text that has not been identified for coding as a letter pair or triad (or some other event), but instead represents a valid word, is compressed by representing each letter with four bits, instead of the eight bits required by ASCII or EBCDIC codes. The mechanisms for this compression are the tables VALTBL and SCNDTBL These are illustrated in FIGS. 1 and 2. The first letter of a word is compressed using VALTBL, and each subsequent letter in that word is compressed using SCNTBL.

In VALTBL is a list of 26 values representing each letter of the alphabet. Of the 26 values, sixteen are non-zero values and the remaining ten are zeroes. The zero values signify that the letters corresponding to them are not valid word-starting letters for that record, i.e., there are no or very few words in the record that start with these letters. Thus, the position of the zero values in VALTBL depends on the contents of the particular record being compressed.

The other table is SCNTBL SCNTBL contains 26 fields, each field representing a letter of the alphabet, in sequence. Each field in SCNTBL contains 26 entries, each entry corresponding to a letter of the alphabet, in sequence. Each entry in a given field contains a value corresponding to the compression code for the next letter in the text string. As with VALTBL, not all 26 letters of the alphabet are valid next letters in the text contained in the record being compressed. For example, for a given record the letter "B" may never be followed by the letter "X". In that event, the entry in the "B" field corresponding to "X" (i.e., the twenty-fourth entry) will contain a zero value. This scheme is based on the high probability that for a given record, no letter in the alphabet will have more than sixteen valid next letters following it. In this way, all next letters can be compressed as a four bit value between zero and fifteen.

As an example, consider the compression of the letters "will." In the exemplary VALTBL, the twenty-third entry, corresponding to "W" is 16. The first letter, "W," will be encoded as 16−1=15, or Fh (1111). The remaining letters are compressed using SCNTBL In the "W" field, the entry corresponding to the letter "I" (i.e., the ninth entry) is the value 5. Thus, the second letter, "I," will be encoded as 5−1=4 (0100). The value of the "L" entry in the "I" field is 7, and the value of the "L" entry in the "L" field is 7, so the last two letters, "LL" will be encoded as 66 (0110 0110). Thus, the letters "will" are compressed to F466h (1111 0100 0110 0110).

LTRS0E. This module may be invoked, for example, for compressing the special case of a comma followed by a space. This combination (or some other frequently occurring combination) is compressed as FFh (1111 1111).

Repetition Event Compression Modules

Single Character Repeat. This is a group of three modules designed to compress a text string consisting of a single character repeated three times or more. The three modules are designed for short, medium and long character repetition strings. The short character repeat module is invoked for 2–11 repetitions of the preceding character. The default prefix used to indicate this compression module (i.e., "repeat the preceding character") is Ah (1010). A short character repeat string is compressed in the form ALh (1010 LLLL), where L=repetitions−2. This results in the compression codes for a short character repeat event being within the range of A0h through A9h. To illustrate, for eight (8) repetitions, L=8−3, which is five (5). So the length of repetition is compressed in the four bits following the prefix as 10d+L=10d+5 =15d (or Fh). Thus, repetition of a character 8 times is encoded as 8Fh (1000 1111).

The medium character repeat module is invoked for 9–12 repetitions of the preceding character. The default prefix used to indicate this compression module is 09h. A medium character repeat string is compressed in the form 9h 7d+L (or 1001 7d+L), where L=repetitions−6. This results in the compression codes for a short character repeat event being within the range of 8Ah through 8Fh. To illustrate, for eight (8) repetitions, L 8−3, which is five (5). So the length of repetition is compressed in the four bits following the prefix as 10d+L=10d+5=15d (or Fh). Thus, repetition of a character 8 times is encoded as 8Fh (1000 1111).

Repeat-Relative. Repetition of a character pair (or other grouping, such as a character quad) where the matching pairs are not the same pair, but where the second pair code can be represented by the value of the first pair ±63. The coding is PPPP FSDD DDDD. P is the prefix F is a flag indicating whether the current pair is the last pair in the sequence of repeated pairs, or whether the next 7 bits indicates the sign and displacement of the next pair in the sequence. S is the sign flag indicating positive or negative difference. D indicates the number that must be added or subtracted from the code for the previous pair to indicate the code for the "repetition." For example, if the second pair code value is equal to the first pair value plus 28, FSDD DDDD=0001 1110 (the flag indicates that the sequence continues, S=0 means positive difference, 01 1110 equals 28). If the next pair code value is equal to the last pair plus 20, then FSDD DDDD=0100 1000 (S=1 for negative, because the difference is the previous difference (28) minus D=8).

ZNZB—Zero/Nibble/Zero/Byte. When a sequence of four characters takes the form of zero-nibble-zero-byte (i.e., first byte=00; second byte=0X; third byte=00; and fourth byte=XX—where X is non-zero value), compression can be implemented by eliminating the zero bytes and nibbles (a nibble is four bits). The ZNZB coding is PPPP XXXX XXXX XXXX, where P is the prefix and the three "X" nibbles represent the three non-zero nibbles found in the uncompressed sequence.

Block Repetition. With reference to FIG. 3, block repetition encoding is accomplished through the use of three internal data structures, the Event Matrix, the Event List, and the Auxiliary Que Buffer. The Event Matrix contains 256 two-byte fields, corresponding to 00 through FF. Thus, each field in the Event Matrix represents a character that may possibly be a starting character in a block repetition event. The Event List contains a number of two-byte fields, each one corresponding to each character address (up to 2048) in the record being scanned. The Auxiliary Que Buffer has the same structure as the Event List.

During the blocking operation, when a valid starting character for a block repetition event is found, its address is stored in the Event Matrix field corresponding to that character. In the corresponding address in the Event List, the actual character code is stored. Thus if "C" were found at address 0A as a valid block starting character, the value 0A would be stored at address 0C in the Matrix, and the value 0C would be stored at address 0A in the Event List.

The next time that same block starting character is detected, the corresponding Matrix address is updated to reflect the address of this most recent occurrence, and the corresponding Event list address will store the address of the previous occurrence. In the above example, if the next valid "C" block (the same block) occurred at address F8, then the value F8 would be stored at 0C in the Matrix, while address F8 in the Event List would store the value 0A (which had previously been in the corresponding Matrix field) in order to point to the previous occurrence of the block start. In this way, the block system points back to the character block that is to be repeated.

The length of the block is stored in the Auxiliary Que Buffer at an addresses corresponding to each occurrence of the block event.

The foregoing disclosure of the preferred embodiment of the present invention has been presented for illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims and their equivalents.

What is claimed is:

1. A method of data compression for compressing a data record made up of a plurality of data elements each made up of a plurality of bits comprising:
   a) scanning the data record to characterize the data content of the record by at least identifying and counting the occurrence of types of data elements, and classifying data elements according to a set of predetermined groups;
   b) determining within the data record the most significant of the set of predetermined groups;
   c) identifying patterns of data elements in the data record in response to the step of determining including detecting and encoding repeating blocks of data elements;
   d) assigning at least one of a set of predetermined compression modes in response to the identifying step; and e) compressing the data record according to at least one of the compression modes responsive to the assigning.

2. The method of claim 1 wherein at least some data elements are eight bit bytes and further comprising determining if data is full range binary data including tracking the eighth bit of the eight bit data elements.

3. The method of claim 1 further comprising compressing the data record using at least one of the predetermined compression modes assigned based upon at least the predetermined groups, and the patterns.

4. The method of claim 3 wherein at least some data elements are represented by eight bit numeric codes, further comprising compressing the eight bit numeric codes with a corresponding four bit code.

5. The method of claim 1 further comprising:

detecting a repeat-relative character sequence that can be expressed as the value of the code for a previously-occurring character sequence plus or minus a given number;

converting the repeat-relative character sequence to a compressed code, said compressed code comprising a repeat-relative prefix, a sign flag, and an offset value, wherein said repeat-relative prefix identifies the type of coding, the sign flag indicates the sign of the offset value, and the offset value indicates the value to be added or subtracted from the value of the code for the previously-occurring character sequence.

6. A system for compressing a data record made up of a plurality of data elements each made up of a plurality of bits comprising:

a) means for scanning the data record to characterize the data content of the record by at least identifying and counting the occurrence of types of data elements, and classifying data elements according to a set of predetermined groups;

b) means for determining within the data record the most significant of the set of predetermined groups;

c) means for identifying patterns of data elements in the data record in response to the step of determining including detecting and encoding repeating blocks of data elements;

d) means for assigning at least one of a set of predetermined compression modes in response to the identifying step; and e) means for compressing the data record according to at least one of the compression modes responsive to the assigning.

7. The system of claim 6 wherein at least some data elements are eight bit bytes and further comprising means for determining if data is full range binary data including tracking the eighth bit of the eight bit data elements.

8. The system of claim 6 further comprising means for compressing the data record using at least one of the predetermined compression modes assigned based upon at least the predetermined groups, and the patterns.

9. The system of claim 8 wherein at least some data elements are represent ed by eight bit numeric codes, further comprising means for compressing the eight bit numeric codes with a corresponding four bit code.

10. The system of claim 6 further comprising:

means for detecting a repeat-relative character sequence that can be expressed as the value of the code for a previously-occurring character sequence plus or minus a given number; and means for converting the repeat-relative character sequence to a compressed code, said compressed code comprising a repeat-relative prefix, a sign flag, and an offset value, wherein said repeat-relative prefix identifies the type of coding, the sign flag indicates the sign of the offset value, and the offset indicates the value to be added or subtracted from the value of the code for the previously-occurring character sequence.

* * * * *